(12) United States Patent
Huang

(10) Patent No.: US 8,716,844 B2
(45) Date of Patent: May 6, 2014

(54) CHIP PACKAGE AND METHOD FOR FORMING THE SAME

(76) Inventor: Yu-Ting Huang, Zhongli (TW)

(*) Notice: Subject to any disclaimer, the term of this patent is extended or adjusted under 35 U.S.C. 154(b) by 0 days.

(21) Appl. No.: 13/416,504

(22) Filed: Mar. 9, 2012

(65) Prior Publication Data

US 2012/0228752 A1   Sep. 13, 2012

(30) Foreign Application Priority Data

Mar. 10, 2011   (CN) .......................... 2011 1 0057693

(51) Int. Cl.
*H01L 23/552* (2006.01)

(52) U.S. Cl.
USPC .................... 257/660; 257/659; 257/E23.114

(58) Field of Classification Search
USPC .................................. 257/659, 660, E23.114
See application file for complete search history.

(56) References Cited

U.S. PATENT DOCUMENTS 6,577,013 B1 * 6/2003 Glenn et al. .................. 257/777

FOREIGN PATENT DOCUMENTS

| TW | 466722 | 12/2001 |
|---|---|---|
| TW | 200830434 | 7/2008 |
| TW | 200845339 | 11/2008 |

* cited by examiner

*Primary Examiner* — Amar Movva
(74) *Attorney, Agent, or Firm* — Liu & Liu

(57) ABSTRACT

A chip package includes: a substrate; a signal pad and a ground pad disposed on the substrate; a first and a second conducting layers disposed on the substrate and electrically connected to the signal pad and the ground pad, respectively, wherein the first and the second conducting layers extend from an upper surface of the substrate towards a lower surface of the substrate along a first and a second side surfaces of the substrate, respectively, and the first and the second conducting layers protrude from the lower surface; and a protection layer disposed on the substrate, wherein the protection layer completely covers the entire portion of the first conducting layer located on the first side surface of the substrate, and the entire portion of the second conducting layer located on the second side surface of the substrate is not covered by the protection layer.

20 Claims, 13 Drawing Sheets

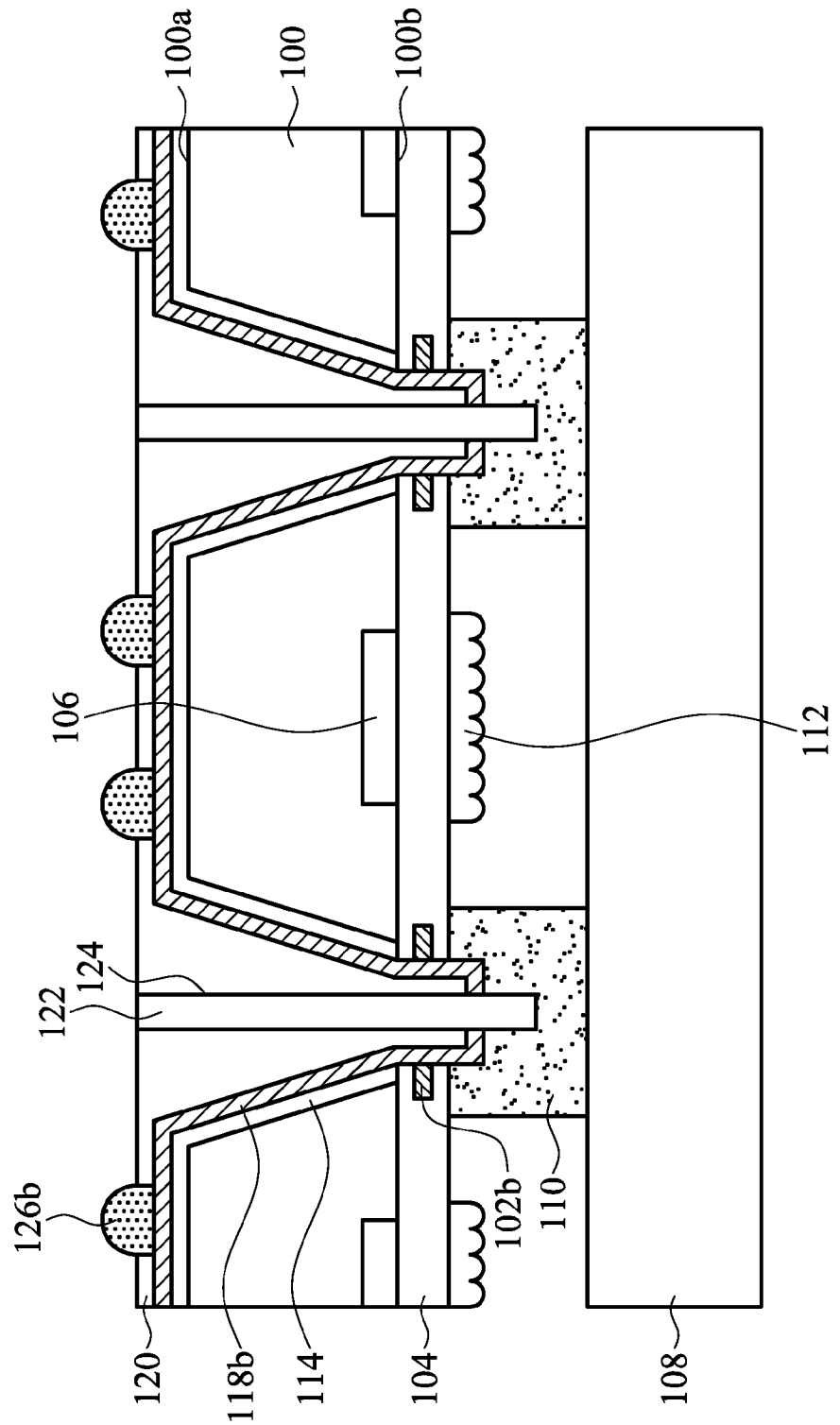

CHIP PACKAGE AND METHOD FOR FORMING THE SAME

CROSS REFERENCE TO RELATED APPLICATIONS

This Application claims priority of China Patent Application No. 201110057693.4, filed on Mar. 10, 2011, the entirety of which is incorporated by reference herein.

BACKGROUND OF THE INVENTION

1. Field of the Invention

The invention relates to a chip package, and in particular relates to a chip package having an electromagnetic interference (EMI) shielding structure and fabrication method thereof.

2. Description of the Related Art

As sizes of chip packages continue to become thinner and lighter and signal transmission speed continues to increase, electromagnetic interference (EMI) and electrostatic discharge (ESD) problems for chip packages have worsened. Because sizes of chip packages continue to get smaller, design of ground wiring in chip packages have become more important. In addition, quality of a signal wire directly influences operation of a chip. Therefore, it is desired to have a chip package provided with an EMI shielding structure, ensuring signal wire quality.

BRIEF SUMMARY OF THE INVENTION

According to an embodiment of the present invention, a chip package is provided. The chip package includes: a substrate; a signal conducting pad disposed on the substrate; a ground conducting pad disposed on the substrate; a first conducting layer disposed on the substrate and electrically connected to the signal conducting pad, wherein the first conducting layer extends from an upper surface of the substrate towards a lower surface of the substrate along a first side surface of the substrate, and the first conducting layer protrudes from the lower surface; a second conducting layer disposed on the substrate and electrically connected to the ground conducting pad, wherein the second conducting layer extends from the upper surface of the substrate towards the lower surface of the substrate along a second side surface of the substrate, and the second conducting layer protrudes from the lower surface; and a protection layer disposed on the substrate, wherein the protection layer completely covers the entire portion of the first conducting layer located on the first side surface of the substrate, and the entire portion of the second conducting layer located on the second side surface of the substrate is not covered by the protection layer.

According to an embodiment of the present invention, a method for forming a chip package is provided. The method includes: providing a substrate, wherein a signal conducting pad and a ground conducting pad are located on the substrate; removing a portion of the substrate from an upper surface of the substrate to form a first hole and a second hole extending towards a lower surface of the substrate, wherein the first hole exposes the signal conducting pad and a second hole exposes the ground conducting pad; forming a first conducting layer on the upper surface of the substrate, wherein the first conducting layer extends on a sidewall and a bottom of the first hole to electrically connect to the signal conducting pad, and the first conducting layer protrudes from the lower surface; forming a second conducting layer on the upper surface of the substrate, wherein the second conducting layer extends on a sidewall and a bottom of the second hole to electrically connect to the ground conducting pad, and the second conducting layer protrudes from the lower surface; forming a patterned protection layer on the upper surface of the substrate, wherein a portion of the patterned protection layer fills into the first hole to cover the first conducting layer in the first hole; performing a first dicing process to remove a portion of the patterned protection layer in the first hole such that a side surface of the first conducting layer is exposed in the first hole and remove a portion of the second conducting layer on the bottom of the second hole; forming a second patterned protection layer on the upper surface of the substrate, wherein the second patterned protection layer fills into the first hole and covers the patterned protection layer in the first hole and the side surface of the first conducting layer; and performing a second dicing process to remove a portion of the second patterned protection layer in the first hole and form a plurality of separate chip packages, wherein the second patterned protection layer remaining in the first hole covers the side surface of the first conducting layer.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
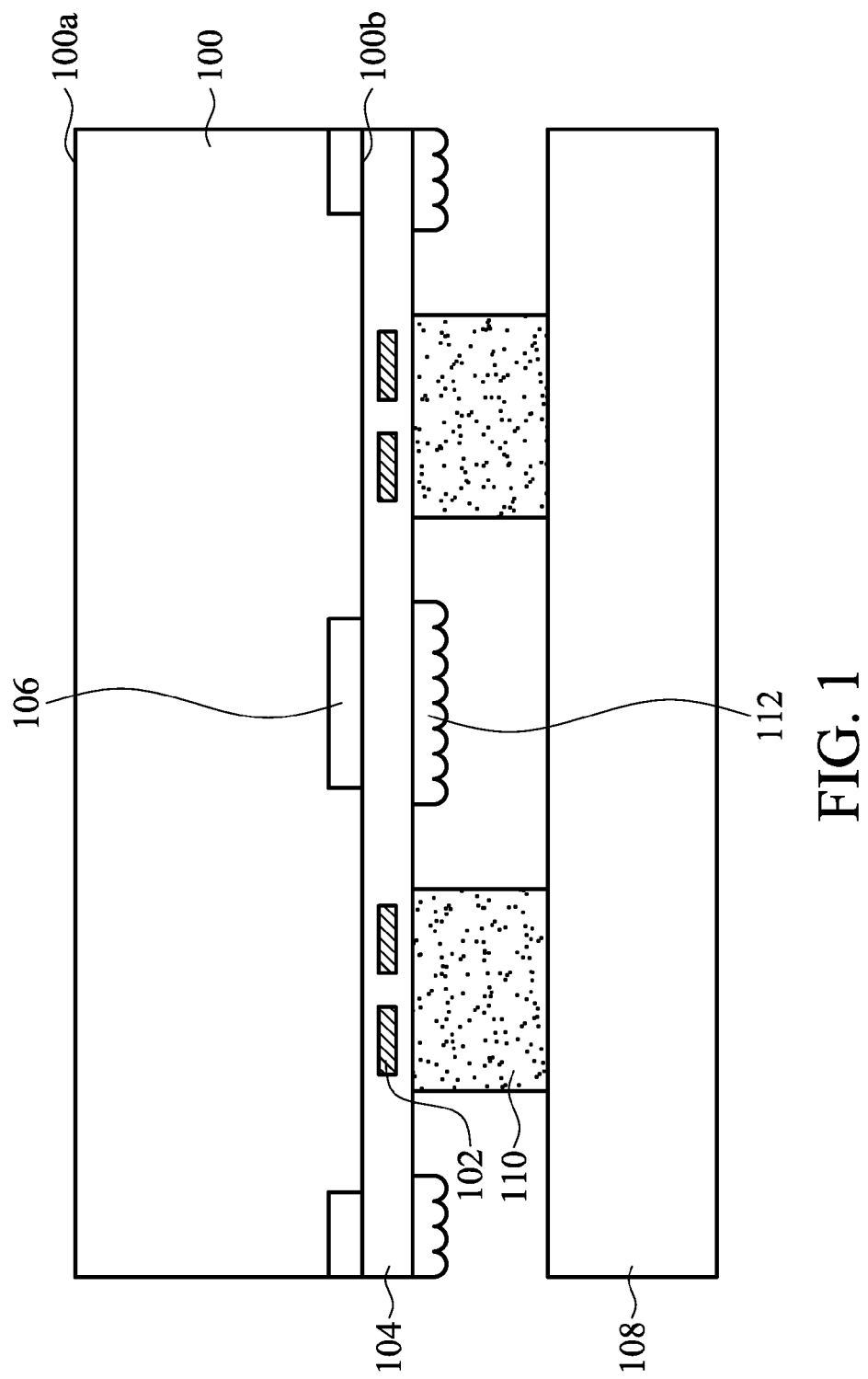
FIGS. 1-8B are cross-sectional views showing the steps of forming a chip package according to an embodiment of the present invention.

The following description is of the best-contemplated mode of carrying out the invention. This description is made for the purpose of illustrating the general principles of the invention and should not be taken in a limiting sense. The scope of the invention is best determined by reference to the appended claims.

The manufacturing method and method for use of the embodiment of the invention are illustrated in detail as follows. It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer, include embodiments where the first and second layers are in direct contact and those where one or more layers are interposing the first and second layers.

A chip package according to an embodiment of the present invention may be used to package a variety of chips. For example, the chip package of the embodiments of the invention may be applied to package chips including, for example, active or passive devices, or electronic components with digital or analog circuits, such as opto electronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power IC modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the above mentioned wafer scale package process may also be adapted to form chip packages of multi-layer integrated circuit devices by stacking a plurality of wafers having integrated circuits. In one embodiment, after the dicing process is performed, the obtained chip package is a chip scale package (CSP). The size of the chip scale package (CSP) may be only slightly larger than the size of the packaged chip. For example, the size of the chip scale package is not larger than 120% of the size of the packaged chip.

FIGS. 1-8B are cross-sectional views showing the steps of forming a chip package according to an embodiment of the present invention. As shown in FIG. 1, a substrate 100 is provided, which has a surface 100a and a surface 100b. The substrate 100 may be, for example, a semiconductor substrate, ceramic substrate, or another suitable substrate. In one embodiment, the substrate 100 is a semiconductor wafer (such as a silicon wafer), and a wafer-level packaging process may be performed to reduce fabrication time and cost.

In one embodiment, at least a device region 106 may be disposed or formed on or in the substrate 100. For example, if the substrate 100 is a semiconductor substrate, the device region 106 may be formed in the substrate 100 in advance by using a semiconductor manufacturing process (such as a doping process and a heat treatment process). As shown in FIG. 1, in one embodiment, the device region 106 may be formed in the substrate 100, which may be adjacent to the surface 100b of the substrate 100. In another embodiment, the substrate 100 is a ceramic substrate. In this case, the device region 106 may be a chip which is disposed on the substrate 100. The device region 106 may be disposed on the surface of the substrate 100. Alternatively, a recess may be formed in the substrate 100 in advance, which may be used to accommodate the device region 106. The device region 106 may include a variety of active devices and/or passive devices. In subsequent descriptions, an image sensor chip package will be taken as an example for illustration. In this case, the device region 106 may include an image sensor device.

In one embodiment, a plurality of conducting pads 102 may be disposed on the substrate 100. As shown in the embodiment in FIG. 1, a dielectric layer 104 may be formed on the surface 100b of the substrate 100. A plurality of conducting pads 102 may be formed in the dielectric layer 104. The conducting pads 102 may include at least a signal conducting pad and at least a ground conducting pad. The signal pad may be electrically connected to elements in the device region 106 through conducting routes formed in the dielectric layer. The ground conducting pad may be electrically connected to a protection circuit through conducting routes formed in the dielectric layer 106. The protection circuit may be used to prevent electrostatic discharge current generated during the fabrication or use of the chip package from impacting the elements in the device region 106 and/or prevent electromagnetic interference. In addition, in one embodiment, the conducting pad 102 may include an annular conducting pad having a through-hole located at a center portion.

As shown in FIG. 1, in one embodiment, a carrier substrate 108 may be optionally disposed on the surface 100b of the substrate 100 to facilitate subsequent processes. A spacer layer 110 may be disposed between the carrier substrate 108 and the substrate 100. In one embodiment, the spacer layer 110, the carrier substrate 108, and the substrate 100 may together surround a substantially closed cavity under the device region 106. In one embodiment, the device region 106 includes an image sensor device. In this case, a microlens array 112 may be disposed in the cavity to improve the light receiving capability of the device region 106. In addition, a transparent substrate (such as a glass substrate, quartz substrate, transparent polymer substrate, or the like) may be chosen to be the carrier substrate 108. In one embodiment, the spacer layer 110 may be a polymer material. In one embodiment, the spacer layer 110 may be located directly below the conducting pad 102.

Figure 2:
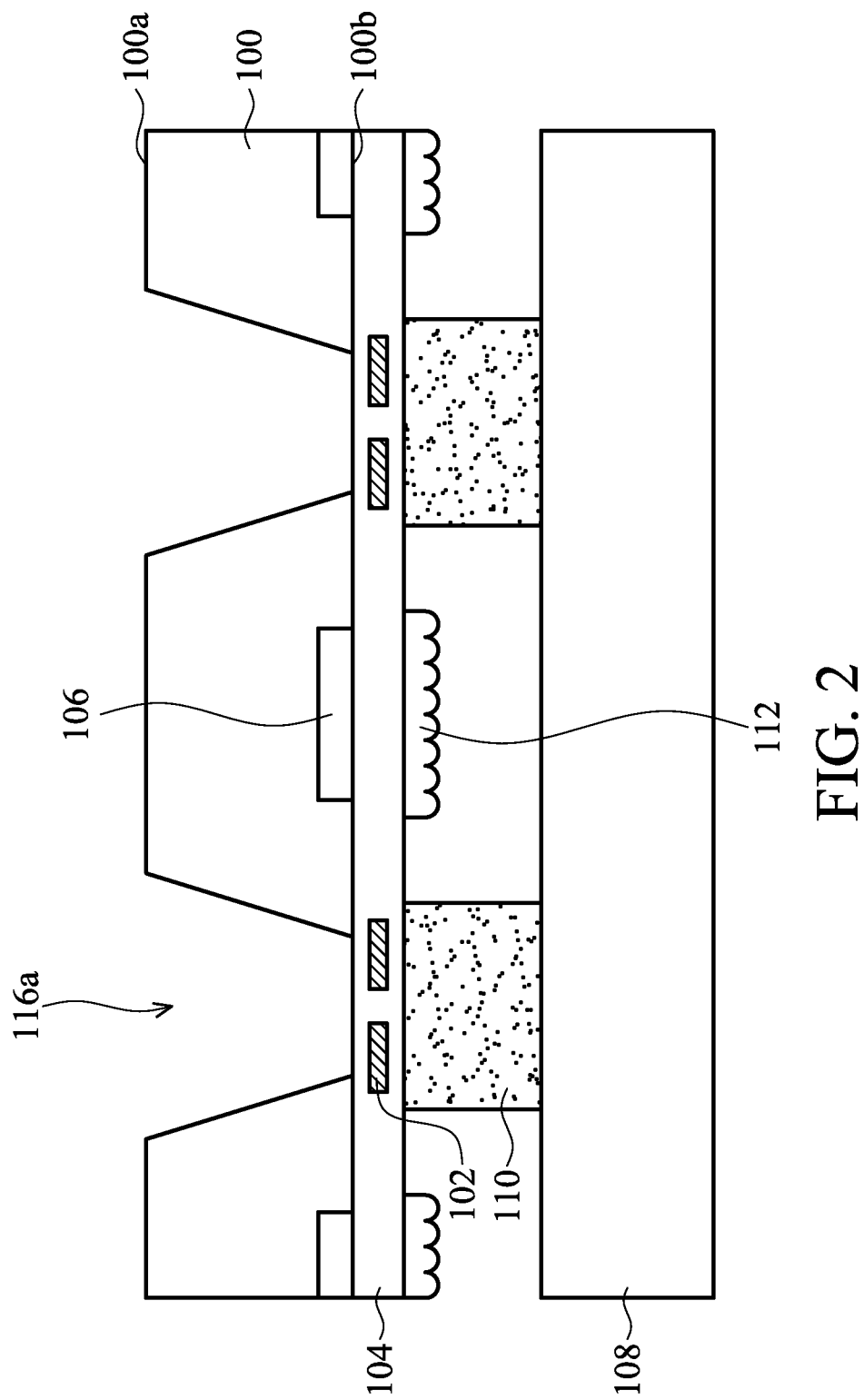

Next, as shown in FIG. 2, the substrate 100 may be optionally thinned to facilitate subsequent processes. In one embodiment, the carrier substrate 108 may be used as a support, and a thinning process is performed to the surface 100a of the substrate 100 to thin down the substrate 100 to a suitable thickness. A suitable thinning processes includes, for example, a mechanical grinding process or a chemical mechanical polishing process.

After the optional thinning process is performed, a portion of the substrate 100 is removed from the surface 100a of the substrate 100 to form holes exposing the conducting pads 102. As shown in FIG. 2, a photolithography process and an etching process may be, for example, performed to form holes 116a. The dielectric layer 104 is exposed at bottoms of the holes 116a.

Figure 3:
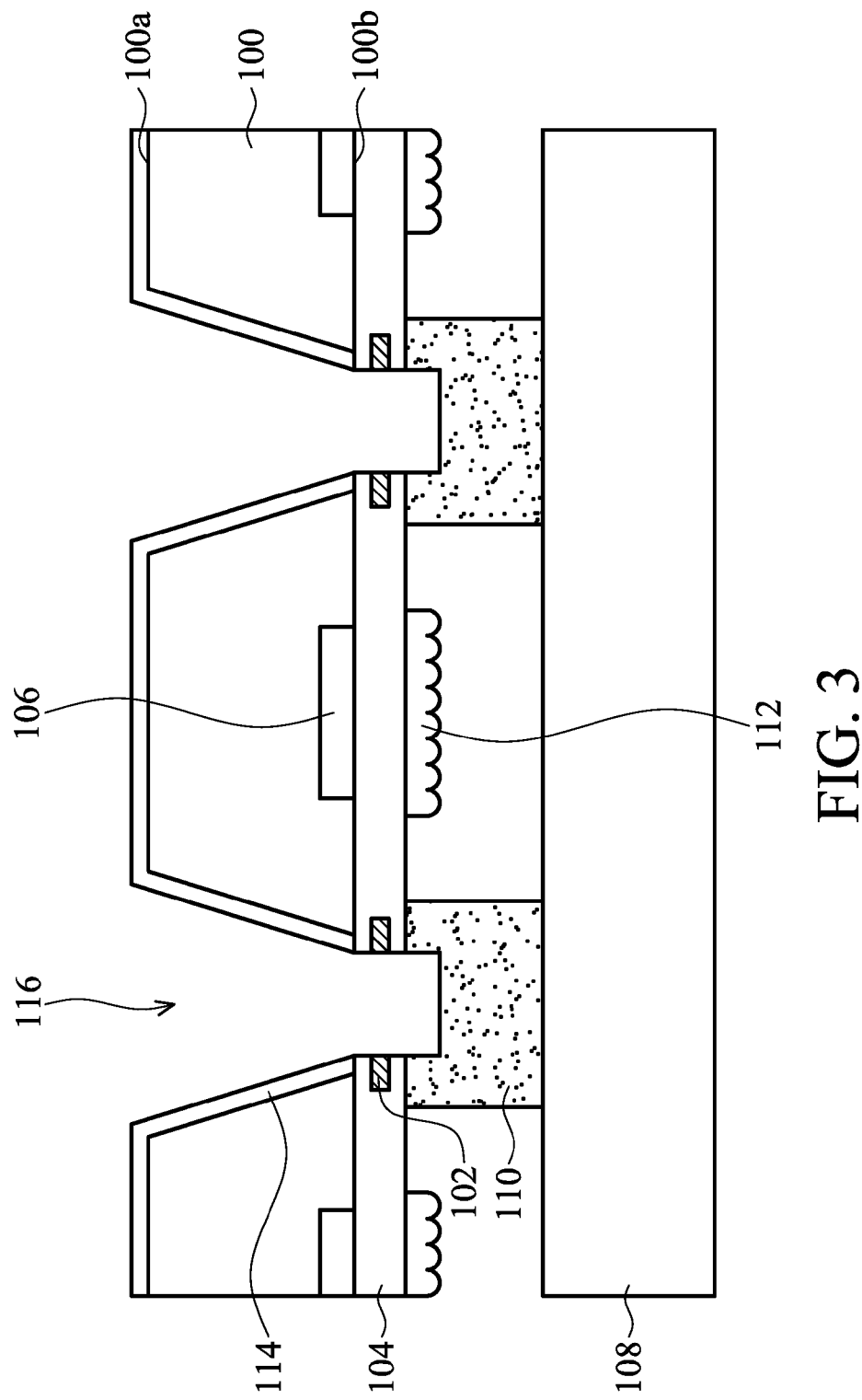

Next, as shown in FIG. 3, an insulating layer 114 is formed on the surface 100a of the substrate 100. The insulating layer 114 may fill into the holes 116a to cover sidewalls and bottoms of the holes 116a. The material of the insulating layer 114 may include, for example, (but is not limited to) an epoxy resin, a solder mask material, or other suitable insulating materials, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The insulating layer 114 may be formed by using a coating process, such as spin coating process, spray coating process, or curtain coating process, or other suitable deposition methods, such as liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition.

However, in one embodiment, it should be appreciated that the formation of the insulating layer 110 is not necessary. In the case that no short circuiting issue exists between a subsequently formed conducting layer and the substrate, the insulating layer 114 may not need to be formed. For example, if the material of the substrate 100 is not a conductive material, the insulating layer 114 may not need to be formed.

Then, a notching process is performed such that the hole 116a extends along a direction towards the conducting pad 102 to form a hole 116. The notching process may be performed by using, for example, a dicing blade. The holes 116 expose side surfaces of the conducting pads 102, wherein parts of the holes 116 expose side surfaces of the signal conducting pads, and other parts of the holes 116 expose side surfaces of the ground conducting pads. In one embodiment, the hole 116 may penetrate through the conducting pad 102. In another embodiment, the bottom of the hole 116 is located under the conducting pad 102 and located in the dielectric layer 104. In yet another embodiment, the hole 116 may further penetrate through the dielectric layer 104 to extend into the spacer layer 110. The bottom of the hole 116 may be located in the spacer layer 110. In one embodiment, the conducting pad 102 is an annular conducting pad having a through-hole located at a canter portion. Thus, the notching process may be performed more smoothly. In addition, in one embodiment, the hole 116 has an inclined sidewall. For example, in one embodiment, a width of the hole 116 near the surface 100a may be larger than a width of the hole 116 near the surface 100b. In another embodiment, a width of the hole 116 near the surface 100a may be smaller than a width of the hole 116 near the surface 100b.

Figure 4:
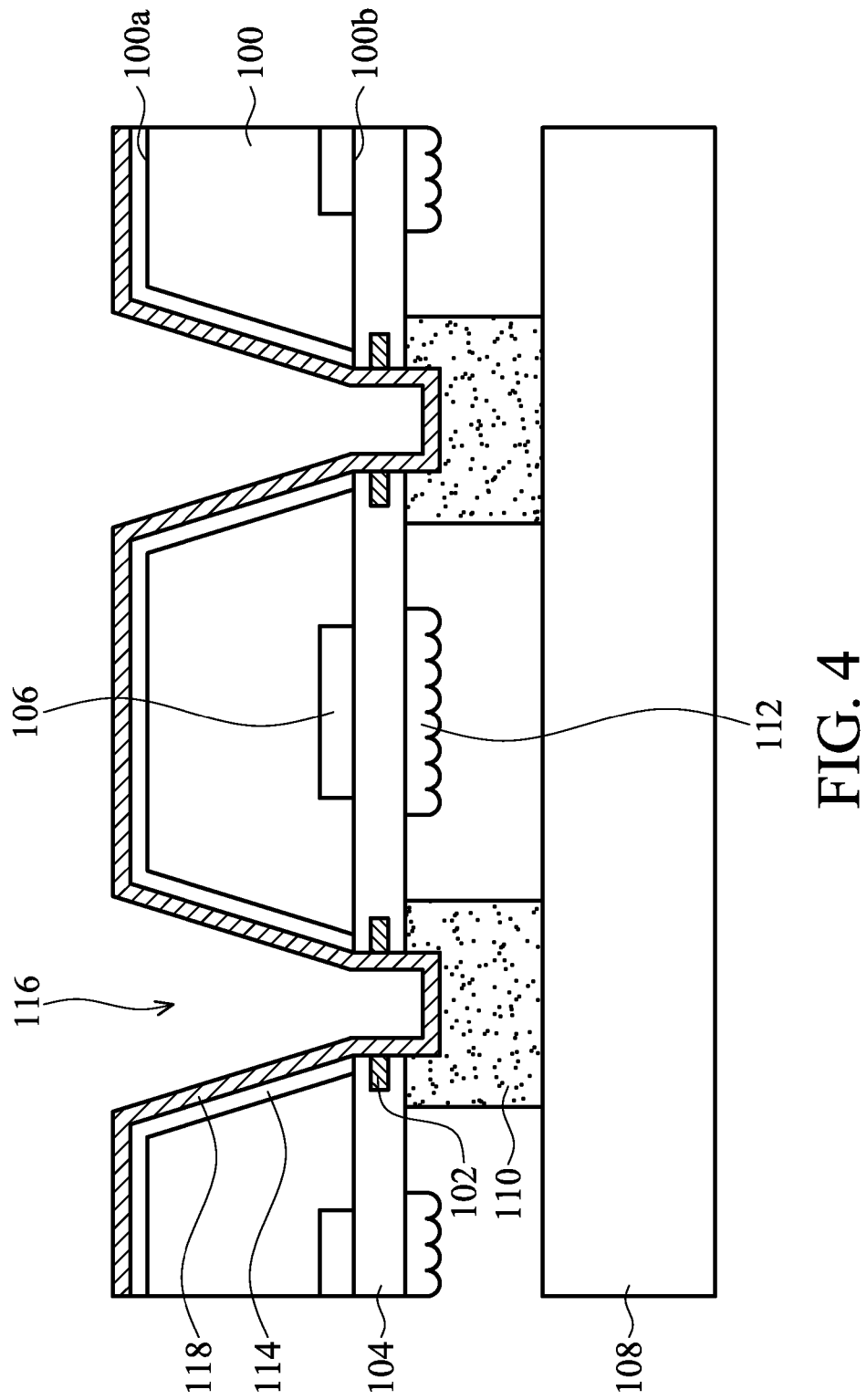

As shown in FIG. 4, a conducting material layer 118 is then formed on the surface 100a of the substrate 100. The conducting material layer 118 may extend onto the sidewall and the bottom of the hole 116 to be electrically connected to the conducting pad 102. Because the hole 116 exposes the conducting pad 102, the conducting material layer 118 formed therein will protrude from the surface 100b of the substrate 100. The material of the conducting material layer 118 may include (but is not limited to) copper, aluminum, gold, platinum, or the like. The fabrication method of the conducting material layer may include (but is not limited to) a physical vapor deposition process, sputtering process, chemical vapor deposition process, electroplating process, or electroless plating process.

Figure 5A:
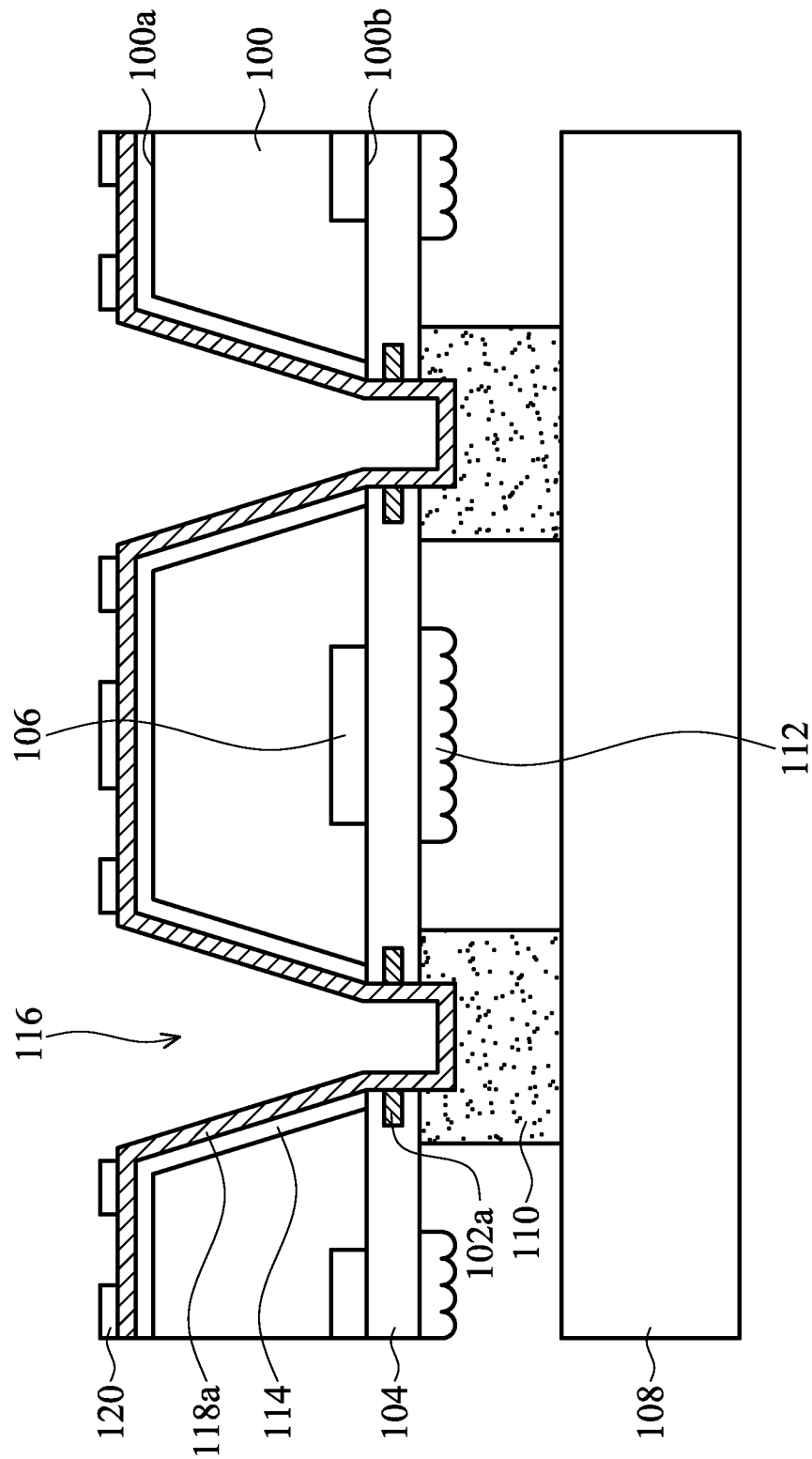
Figure 5B:
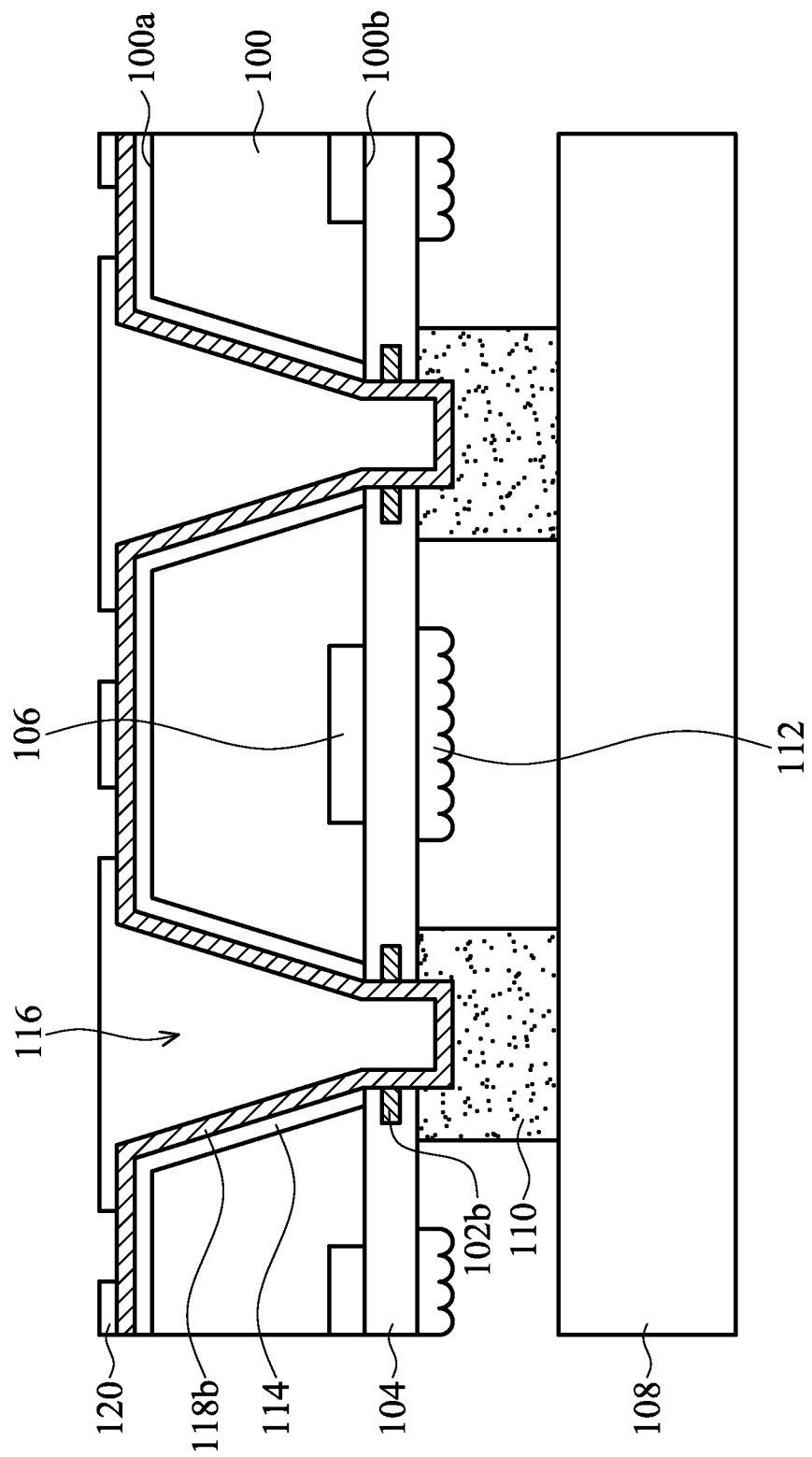

Then, the conducting material layer 118 is patterned according to requirements to form a conducting layer 118a and a conducting layer 118b which are electrically connected to a ground conducting pad 102a and a signal conducting pad 102b, as shown in FIGS. 5A and 5B, wherein FIGS. 5A and 5B respectively show cross-sectional views of different two regions of the substrate (and the following FIGS. 6A, 7A, and 8A and FIGS. 6B, 7B, and 8B are cross-sectional views illustrating the fabrication process steps in the two regions. In FIG. 5A, the conducting layer 118a extends from the surface 100a of the substrate 100 into the hole 116 exposing the side surface of the ground conducting pad 102a and electrically contacts with the ground conducting pad 102a, wherein a contact region between the conducting layer 118a and the ground conducting pad 102a is located between a top terminal and a bottom terminal of the conducting layer 118a. In FIG. 5B, the conducting layer 118b extends from the surface 100a of the substrate 100 into the hole 116 exposing the side surface of the signal conducting pad 102b and electrically contacts with the signal conducting pad 102b, wherein a contact region between the conducting layer 118b and the signal conducting pad 102b is located between a top terminal and a bottom terminal of the conducting layer 118b.

Then, as shown in FIGS. 5A and 5B, a patterned protection layer 120 is formed on the surface 100a of the substrate 100. The formation method of the patterned protection layer 120 may include forming a protection material layer on the surface 100a of the substrate 100, and performing an exposure process, development process, and curing process to the protection material layer. The patterned protection layer 120 includes, for example, (but is not limited to) a solder mask material such as green paint.

As shown in FIG. 5A, the patterned protection layer 120 is located on the conducting layer 118a and has openings exposing the conducting layer 118a, wherein conducting bumps may be formed in the openings in a subsequent process. In addition, there is substantially no protection layer 120 in the hole 116 having the conducting layer 118a formed therein. Thus, the portion of the conducting layer 118a located in the hole 116 is substantially and/or completely exposed without being covered by the patterned protection layer 120.

As shown in FIG. 5B, the patterned protection layer 120 is located on the conducting layer 118b and has openings exposing the conducting layer 118b, wherein conducting bumps may be formed in the openings in a subsequent process. In addition, the patterned protection layer 120 further extends into the hole 116 having the conducting layer 118b formed therein. In one embodiment, the patterned protection layer 120 may substantially and/or completely be filled into the hole 116 having the conducting layer 118b formed therein.

Figure 6A:
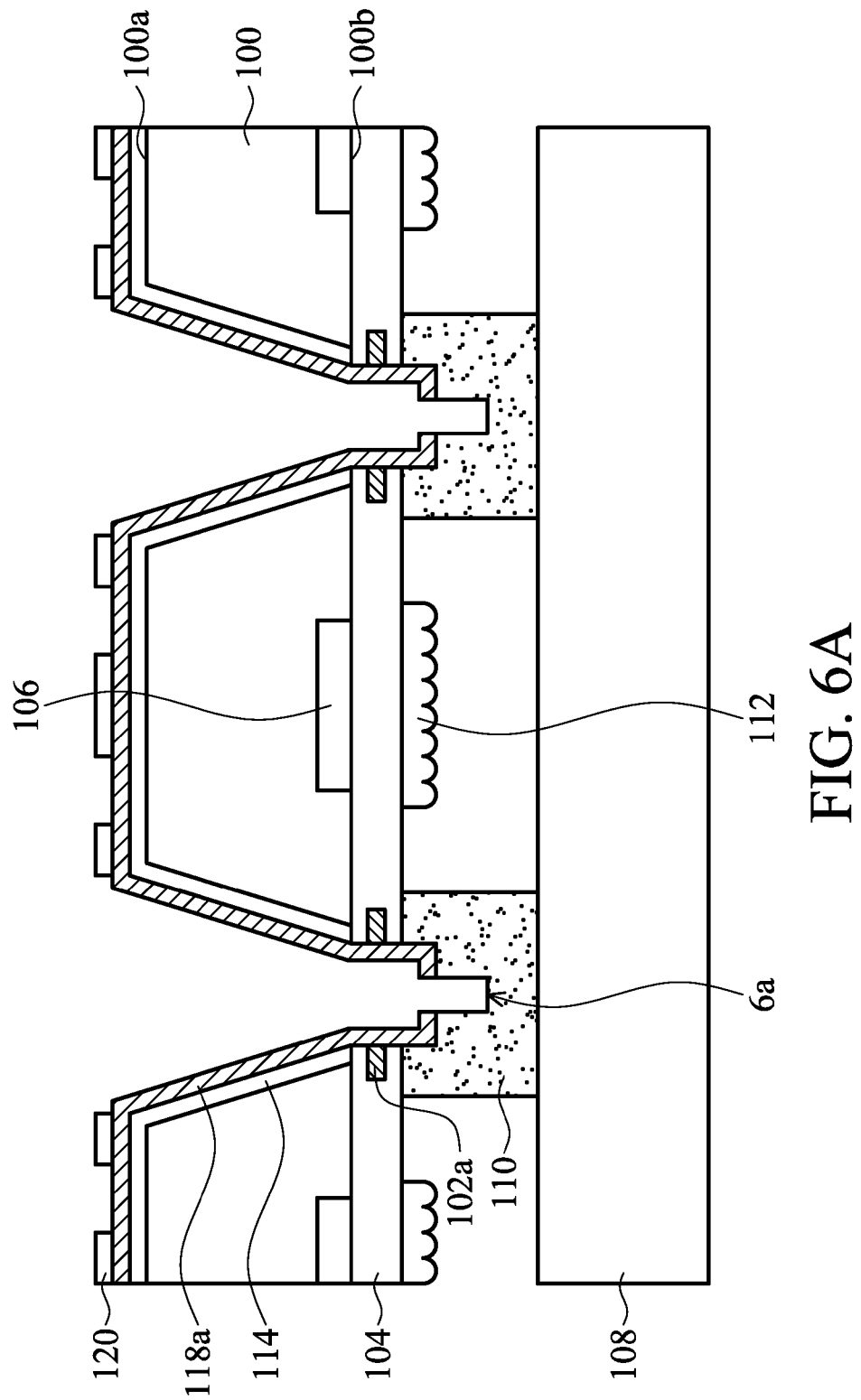

Then, a first dicing process (or so-called pre-dicing process) is performed to cut through a portion of the conducting layer on the bottom of the hole 116. As shown in FIG. 6A, the first dicing process includes cutting through the conducting layer 118a located on the bottom of the hole and electrically connecting the ground conducting pad 102a to form a notch 6a. A diced surface (or so-called side surface) of the conducting layer 118a at the bottom of the hole is exposed in the hole. In addition, in one embodiment, the hole 116 may serve as an alignment mark of a subsequent dicing process.

Figure 6B:
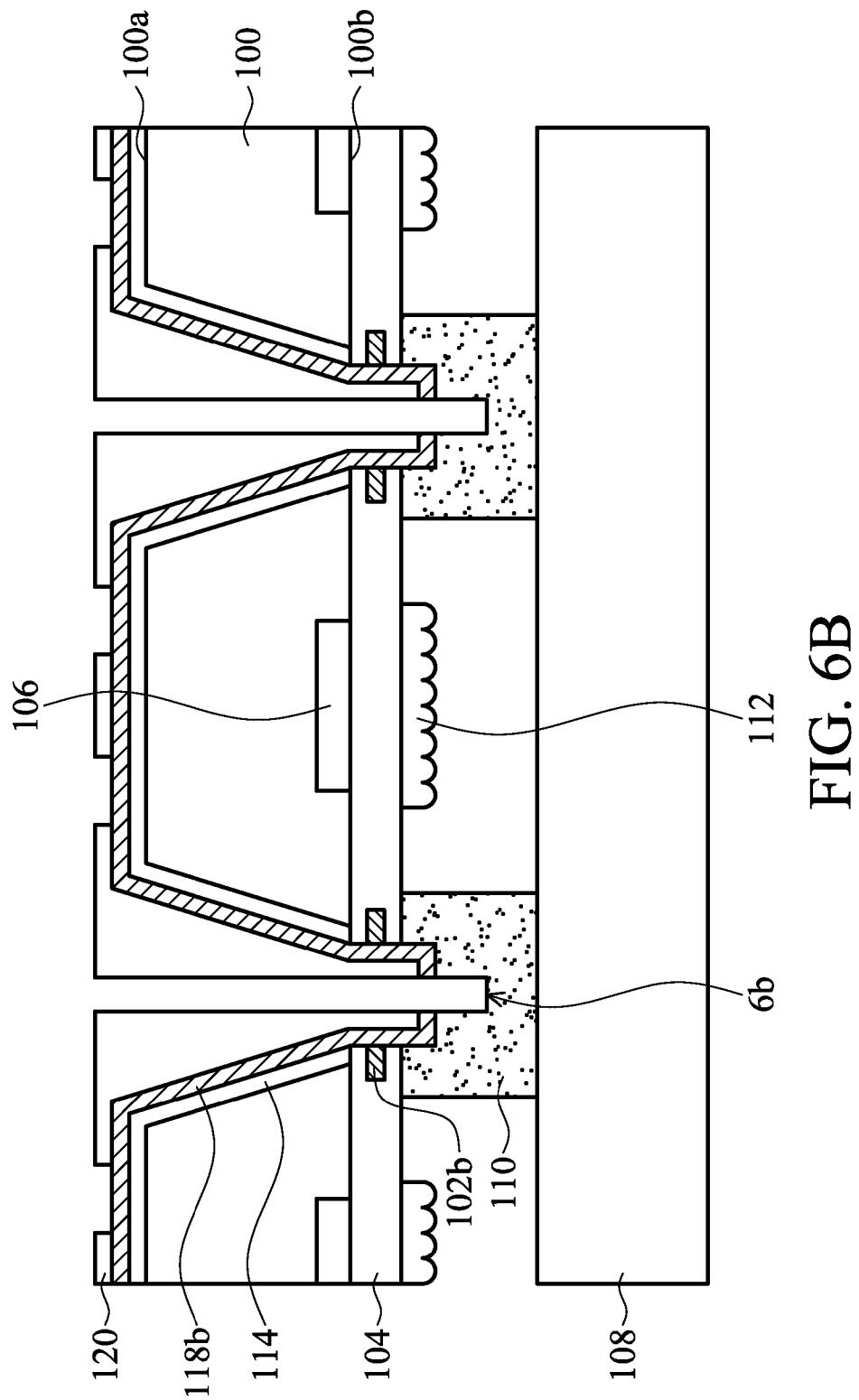

As shown in FIG. 6B, the first dicing process further includes cutting and removing the patterned protection layer 120 in the hole and cutting through the conducting layer 118b located on the bottom of the hole and electrically connecting the signal conducting pad 102b to form a notch 6b. A diced surface (or so-called side surface) of the conducting layer 118b at the bottom of the hole is exposed in the hole.

Figure 7A:
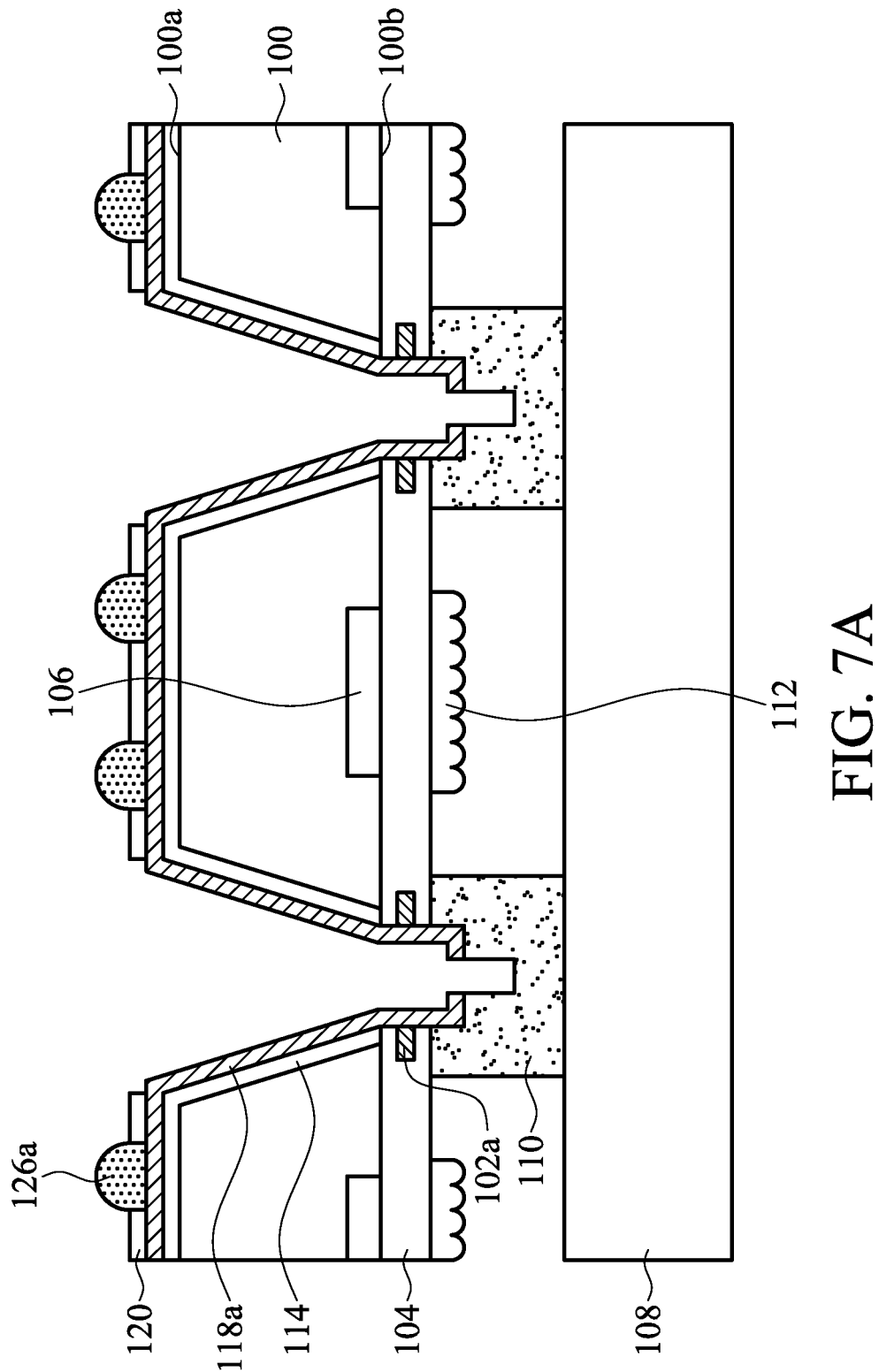

Next, a second patterned protection layer is formed on the surface 100a of the substrate 100. As shown in FIG. 7A, the second patterned protection layer substantially and/or completely does not fill into the hole exposing the conducting layer 118a. Thus, the conducting layer 118a and the diced surface (or so-called side surface) remains exposed in the hole.

As shown in FIG. 7B, the second patterned protection layer 122 fills into the notch 6b (see FIG. 6B). In one embodiment, the materials of the second patterned protection layer 122 and the patterned protection layer 120 may be the same. In another embodiment, the material of the second patterned protection layer 122 may be different from that of the patterned protection layer 120. In one embodiment, the patterned protection layer 120 and the second patterned protection layer 122 are substantially and/or completely filled into the hole. The second patterned protection layer 122 covers a portion of the patterned protection layer 120 and covers the diced surface (or so-called side surface) of the conducting layer 118b originally exposed at the bottom of the hole.

In one embodiment, the patterned protection layer 120 and the second patterned protection layer 122 directly contact with each other, and a contact interface 124 may be formed therebetween. In this case, the diced surface (or so-called side surface) of the conducting layer 118b is substantially coplanar with the contact interface 124. In one embodiment, the contact interface 124 may be observed by using, for example, electron microscopy. However, in some embodiments, it should be appreciated that the contact interface 124 may not exist, not be easily observed, or disappear in subsequent processes due to the factors such as the material and/or the fabrication process of the patterned protection layer 120 and the second patterned protection layer 122.

Next, conducting bumps may be optionally formed on the surface 100a of the substrate 100. As shown in FIG. 7A, conducting bumps 126 may be formed in the openings of the protection layer 120 on the surface 100a of the substrate 100 to electrically contact with the conducting layer 118a thereunder. In one embodiment, the conducting bump 126a may help to lead current (such as an electrostatic discharge current) out from the ground conducting pad 102a. In one embodiment, the conducting bump 126a may not be electrically connected to the ground conducting pad 102a and serve as a dummy conducting bump which may be used to balance an encountered force.

As shown in FIG. 7B, conducting bumps 126b may be formed in the openings of the protection layer 120 on the surface 100a of the substrate 100 to electrically contact with the conducting layer 118b thereunder. In one embodiment, the conducting bump 126b is electrically connected to the device region 106 through the conducting layer 118b and the signal conducting pad 102b. The conducting bump 126b may therefore be used to input an electrical signal into and/or output an electrical signal from the device region 106 such that the chip can operate.

Then, a second dicing process is performed along predetermined scribe lines (penetrating through the notches) to form a plurality of separate chip packages. In one embodiment, a thickness of a dicing blade used in the second dicing process is thinner than that used in the first dicing process.

Figure 8A:
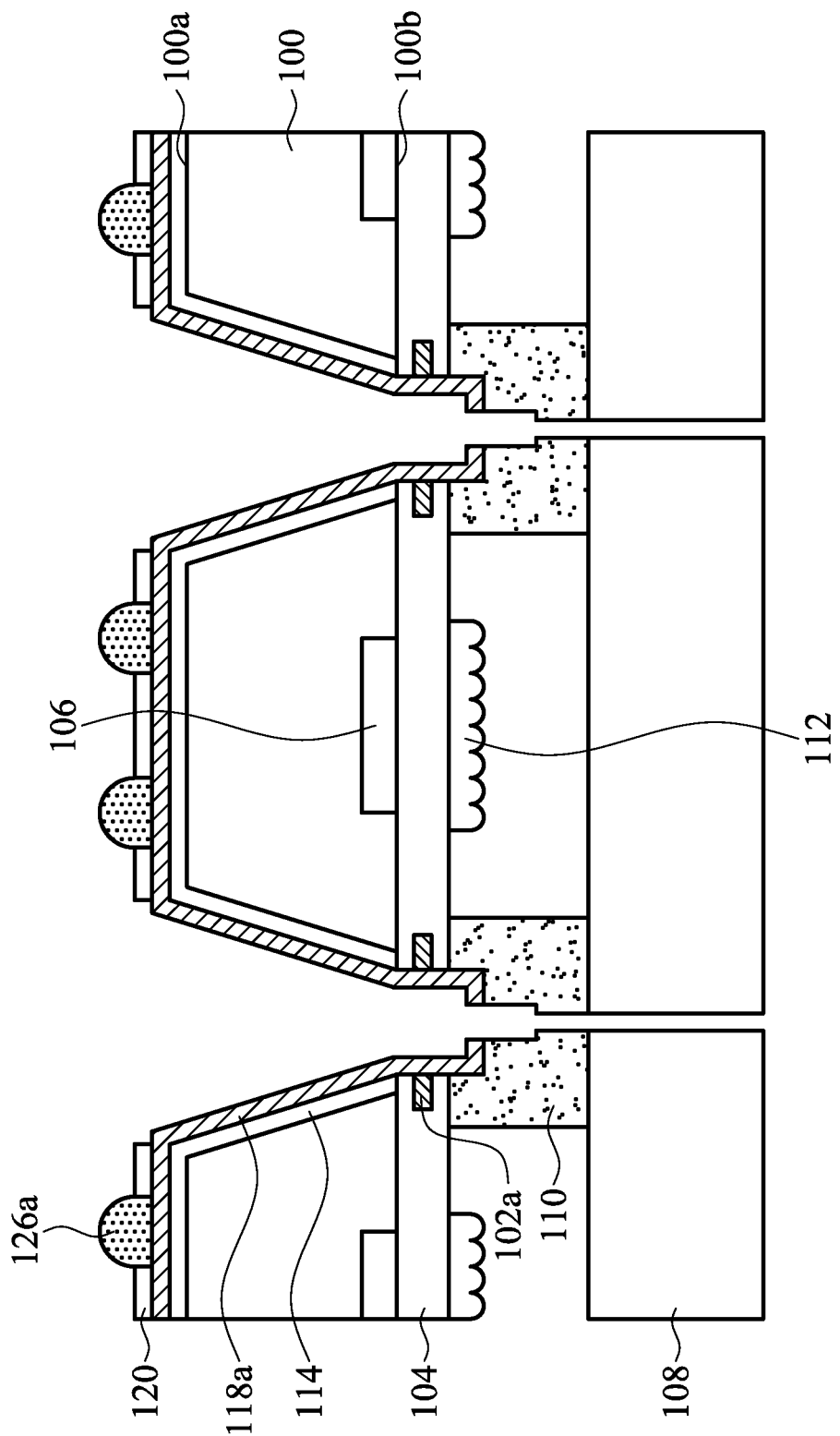

As shown in FIG. 8A, in the embodiment where the spacer layer 110 and the carrier substrate 108 are formed, the second dicing process includes cutting and removing a portion of the spacer layer 110 and the carrier substrate 108. In the embodiment where the spacer layer 110 and the carrier substrate 108 are not formed (for example, the hole only extends to the bottom terminal of the conducting layer 118a), the second dicing process may substantially not cut the material in the hole exposing the conducting layer 118a. After the second dicing process is performed, the sidewall of the hole now is a side surface of the substrate portion of one of the chip packages. In one embodiment, because the hole has an inclined sidewall, the side surface of the substrate portion of the chip package is an inclined side surface.

Figure 8B:
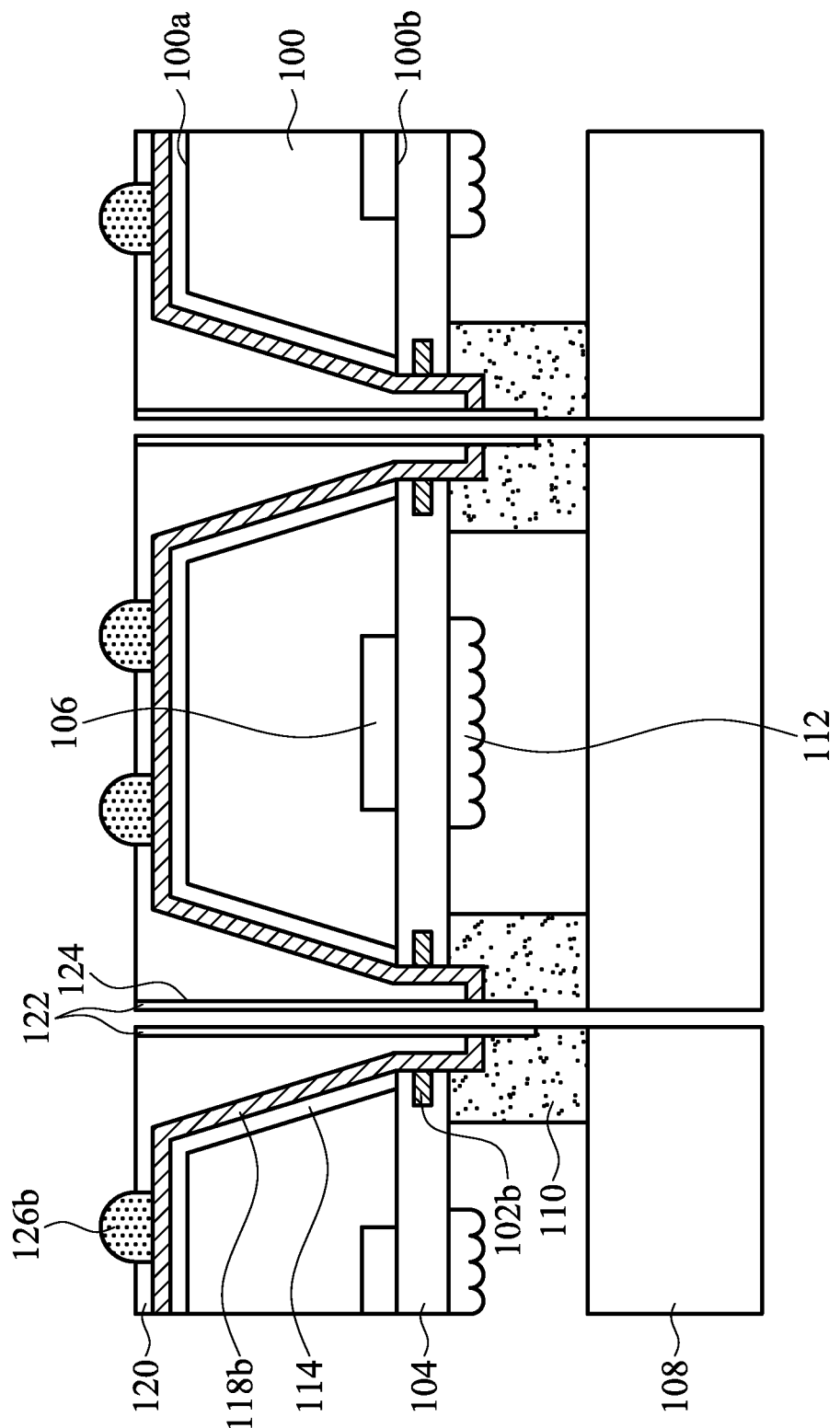

As shown in FIG. 8B, the second dicing process further includes dicing and removing a portion of the second patterned protection layer 122. In one embodiment, because a thinner dicing blade is used in the second dicing process, the second patterned protection layer 122 is not completely removed. Thus, as shown in FIG. 8B, the diced surface (or so-called side surface) of the conducting layer 118b in the hole formed during the first dicing process is still completely covered by the remaining second patterned protection layer 122. Thus, the patterned protection layer 120 and the second patterned protection layer 122 may completely cover the portion of the conducting layer 118b located on the side surface of the substrate 100 and electrically connected to the signal conducting pad 102b. Thus, the conducting layer 118b may be fully protected to ensure output and/or input of electrical signals.

Figure 9:
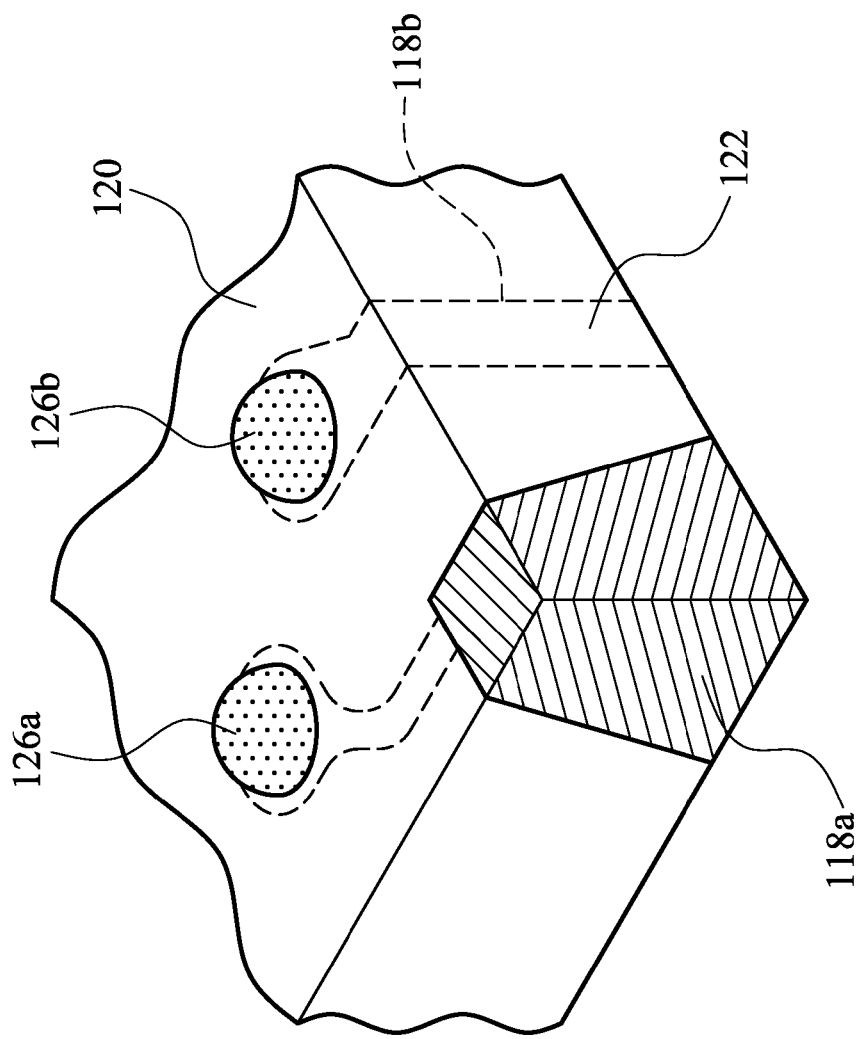
FIG. 9 is an illustrative three-dimensional view showing a chip package according to an embodiment of the present invention.

FIG. 9 is an illustrative three-dimensional view showing a chip package according to an embodiment of the present invention, which shows one of the formed chip packages after the dicing process, wherein same or similar reference numbers are used to designate same or similar elements. Also referring to FIGS. 8A, 8B, and 9, the formed chip package may have the conducting layer 118b electrically connected to the signal conducting pad 102b. The conducting layer 118b may extend from the upper surface 100a of the substrate 100 towards the lower surface 100b of the substrate 100 along the side surface of the substrate 100 (such as the side surface covered by the conducting layer 118b shown in FIG. 9), wherein the conducting layer 118b may protrude from the lower surface 100b. Moreover, for the conducting layer 118b, beside the contact region with the conducting bump 126b, the conducting layer 118b may be substantially and/or completely covered by the patterned protection layer 120 and the second patterned protection layer 122. Thus, quality of the conducting layer 118b may be ensured.

In addition, the formed chip package may also have the conducting layer 118a electrically connected to the ground conducting pad 102a. The conducting layer 118a may extend from the upper surface 100a of the substrate 100 towards the lower surface 100b of the substrate 100 along a side surface of the substrate 100 (such as the side surface covered by the conducting layer 118a shown in FIG. 9), wherein the conducting layer 118a may protrude from the lower surface 100b. Taking the embodiment shown in FIG. 9 as an example, the conducting layer 118a may be located on a corner portion of the substrate 100 to cover two adjacent side surfaces. For the conducting layer 118a, the entire portion of the conducting layer 118a located on the side surface of the substrate 100 substantially is not covered by any protection layer. Thus, there is an exposed conducting layer on the side surface of the substrate of the chip package according to the embodiment of the invention, wherein the exposed conducting layer is electrically connected to the ground conducting pad. The exposed (ground) conducting layer may be easily connected to another electronic element such that electrostatic discharge current may be led out or the influence of electromagnetic interference may be reduced.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a substrate;
   a signal conducting pad disposed on the substrate;
   a ground conducting pad disposed on the substrate;
   a first conducting layer disposed on the substrate and electrically connected to the signal conducting pad, wherein the first conducting layer extends from an upper surface of the substrate towards a lower surface of the substrate along a first side surface of the substrate, and the first conducting layer protrudes from the lower surface;
   a second conducting layer disposed on the substrate and electrically connected to the ground conducting pad, wherein the second conducting layer extends from the upper surface of the substrate towards the lower surface of the substrate along a second side surface of the substrate, and the second conducting layer protrudes from the lower surface; and
   a protection layer disposed on the substrate, wherein the protection layer completely covers the entire portion of the first conducting layer located on the first side surface of the substrate, and the entire portion of the second conducting layer located on the second side surface of the substrate is not covered by the protection layer.

2. The chip package as claimed in claim 1, wherein the protection layer has a first protection layer and a second protection layer, and the first protection layer directly contacts with the second protection layer such that a contact interface is formed between the first protection layer and the second protection layer.

3. The chip package as claimed in claim 2, wherein a side surface of the first conducting layer is coplanar with the contact interface.

4. The chip package as claimed in claim 3, wherein the second protection layer completely covers the side surface of the first conducting layer.

5. The chip package as claimed in claim 1, further comprising:
a carrier substrate disposed on the lower surface of the substrate; and
a spacer layer disposed between the carrier substrate and the lower surface of the substrate.

6. The chip package as claimed in claim 5, wherein the first conducting layer and the second conducting layer extend into the spacer layer.

7. The chip package as claimed in claim 6, wherein a portion of the protection layer extends into the spacer layer.

8. The chip package as claimed in claim 1, further comprising a first conducting bump disposed on the upper surface of the substrate, wherein the first conducting bump is electrically connected to the first conducting layer.

9. The chip package as claimed in claim 1, further comprising a second conducting bump disposed on the upper surface of the substrate, wherein the second conducting bump is electrically connected to the second conducting layer.

10. The chip package as claimed in claim 1, wherein a contact region between the first conducting layer and the signal conducting pad is located between a top terminal and a bottom terminal of the first conducting layer, and a contact region between the second conducting layer and the ground conducting pad is located between a top terminal and a bottom terminal of the second conducting layer.

11. A method for forming a chip package, comprising:
providing a substrate, wherein a signal conducting pad and a ground conducting pad are located on the substrate;
removing a portion of the substrate from an upper surface of the substrate to form a first hole and a second hole extending towards a lower surface of the substrate, wherein the first hole exposes the signal conducting pad and a second hole exposes the ground conducting pad;
forming a first conducting layer on the upper surface of the substrate, wherein the first conducting layer extends on a sidewall and a bottom of the first hole to electrically connect to the signal conducting pad, and the first conducting layer protrudes from the lower surface;
forming a second conducting layer on the upper surface of the substrate, wherein the second conducting layer extends on a sidewall and a bottom of the second hole to electrically connect to the ground conducting pad, and the second conducting layer protrudes from the lower surface;
forming a patterned protection layer on the upper surface of the substrate, wherein a portion of the patterned protection layer fills into the first hole to cover the first conducting layer in the first hole;
performing a first dicing process to remove a portion of the patterned protection layer in the first hole such that a side surface of the first conducting layer is exposed in the first hole and remove a portion of the second conducting layer on the bottom of the second hole;
forming a second patterned protection layer on the upper surface of the substrate, wherein the second patterned protection layer fills into the first hole and covers the patterned protection layer in the first hole and the side surface of the first conducting layer; and
performing a second dicing process to remove a portion of the second patterned protection layer in the first hole and form a plurality of separate chip packages, wherein the second patterned protection layer remaining in the first hole covers the side surface of the first conducting layer.

12. The method for forming a chip package as claimed in claim 11, further comprising disposing a spacer layer on the lower surface of the substrate before the first hole and the second hole are formed.

13. The method for forming a chip package as claimed in claim 12, further comprising disposing a carrier substrate on the spacer layer.

14. The method for forming a chip package as claimed in claim 13, wherein the first hole and the second hole extend into the spacer layer.

15. The method for forming a chip package as claimed in claim 14, wherein the step of performing the first dicing process comprises removing a portion of the spacer layer under the bottom of the first hole and the bottom of the second hole.

16. The method for forming a chip package as claimed in claim 15, wherein the step of performing the first dicing process comprises removing a portion of the carrier substrate.

17. The method for forming a chip package as claimed in claim 16, wherein the step of the second dicing process comprises cutting through the carrier substrate.

18. The method for forming a chip package as claimed in claim 11, wherein the first conducting layer and the second conducting layer are simultaneously formed.

19. The method for forming a chip package as claimed in claim 11, further comprising disposing a first conducting bump on the substrate, wherein the first conducting bump is electrically connected to the first conducting layer.

20. The method for forming a chip package as claimed in claim 11, further comprising disposing a second conducting bump on the substrate, wherein the second conducting layer is electrically connected to the second conducting layer.

* * * * *